US008173985B2

(12) United States Patent
Bergstedt et al.

(10) Patent No.: US 8,173,985 B2
(45) Date of Patent: May 8, 2012

(54) BEAM TRANSPORT SYSTEM FOR EXTREME ULTRAVIOLET LIGHT SOURCE

(75) Inventors: Robert A. Bergstedt, Carlsbad, CA (US); William N. Partlo, Poway, CA (US); Igor V. Fomenkov, San Diego, CA (US); Nam-Hyong Kim, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 247 days.

(21) Appl. No.: 12/638,092

(22) Filed: Dec. 15, 2009

(65) Prior Publication Data

US 2011/0140008 A1 Jun. 16, 2011

(51) Int. Cl.
*H05G 2/00* (2006.01)
*H01L 21/027* (2006.01)
*G03F 7/20* (2006.01)

(52) U.S. Cl. ......................... 250/504 R; 355/71; 355/75

(58) Field of Classification Search .............. 250/504 R; 355/71, 75
See application file for complete search history.

(56) References Cited

U.S. PATENT DOCUMENTS 5,577,092 A 11/1996 Kublak et al.
6,040,566 A 3/2000 Rioland et al.
6,549,551 B2 4/2003 Partlo et al.
6,567,450 B2 5/2003 Myers et al.
6,625,191 B2 9/2003 Knowles et al.
6,842,251 B1 1/2005 Holden et al.
6,972,421 B2 12/2005 Melnychuk et al.
7,491,954 B2 * 2/2009 Bykanov et al. .......... 250/504 R
7,598,509 B2 10/2009 Ershov et al.
2008/0087847 A1 4/2008 Bykanov et al.
2008/0197297 A1 8/2008 Akins et al.

FOREIGN PATENT DOCUMENTS

JP 2008-103151 1/2008
JP 2008-042048 2/2008

OTHER PUBLICATIONS

Lee W. Young, officer of the International Searching Authority, issued International Search Report in related application PCT/US10/59280, dated Feb. 11, 2011, 2 pages.
Lee W. Young, officer of the International Searching Authority, issued Written Opinion in related application PCT/US10/59280, dated Feb. 11, 2011, 5 pages.
Technical Data Sheet for "Reflection and Material Properties for CO2 Laser Metal Mirrors used at 10.6um," II-VI Infrared, created Feb. 18, 2008, 2 pages, published online at www.iiviinfrared.com.
U.S. Appl. No. 61/200,222, filed Nov. 24, 2008.
U.S. Appl. No. 12/592,107, filed Nov. 18, 2009.
U.S. Appl. No. 61/168,033, filed Apr. 9, 2009.

* cited by examiner

*Primary Examiner* — David A Vanore
(74) *Attorney, Agent, or Firm* — DiBerardino Law LLC

(57) ABSTRACT

An extreme ultraviolet light system includes a drive laser system that produces an amplified light beam; a target material delivery system configured to produce a target material at a target location; an extreme ultraviolet light vacuum chamber defining an interior vacuum space that houses an extreme ultraviolet light collector and the target location; and a beam delivery system that is configured to receive the amplified light beam emitted from the drive laser system and to direct the amplified light beam toward the target location. The beam delivery system includes a beam expansion system that expands a size of the amplified light beam and a focusing element that is configured and arranged to focus the amplified light beam at the target location.

38 Claims, 11 Drawing Sheets

BEAM TRANSPORT SYSTEM FOR EXTREME ULTRAVIOLET LIGHT SOURCE

TECHNICAL FIELD

The disclosed subject matter relates to a beam transport system for amplified light of a high power laser system.

BACKGROUND

Extreme ultraviolet ("EUV") light, for example, electromagnetic radiation having wavelengths of around 50 nm or less (also sometimes referred to as soft x-rays), and including light at a wavelength of about 13 nm, can be used in photolithography processes to produce extremely small features in substrates, for example, silicon wafers.

Methods to produce EUV light include, but are not necessarily limited to, converting a material into a plasma state that has an element, for example, xenon, lithium, or tin, with an emission line in the EUV range. In one such method, often termed laser produced plasma ("LPP"), the required plasma can be produced by irradiating a target material, for example, in the form of a droplet, stream, or cluster of material, with an amplified light beam that can be referred to as a drive laser. For this process, the plasma is typically produced in a sealed vessel, for example, a vacuum chamber, and monitored using various types of metrology equipment.

$CO_2$ amplifiers and lasers, which output an amplified light beam at a wavelength of about 10600 nm, can present certain advantages as a drive laser irradiating the target material in an LPP process. This may be especially true for certain target materials, for example, for materials containing tin. For example, one advantage is the ability to produce a relatively high conversion efficiency between the drive laser input power and the output EUV power. Another advantage of $CO_2$ drive amplifiers and lasers is the ability of the relatively long wavelength light (for example, as compared to deep UV at 198 nm) to reflect from relatively rough surfaces such as a reflective optic that has been coated with tin debris. This property of 10600 nm radiation can allow reflective mirrors to be employed near the plasma for, for example, steering, focusing and/or adjusting the focal power of the amplified light beam.

SUMMARY

In some general aspects, an extreme ultraviolet (EUV) light system includes a drive laser system that produces an amplified light beam; a target material delivery system configured to produce a target material at a target location; and a beam delivery system that is configured to receive the amplified light beam emitted from the drive laser system and to direct the amplified light beam toward the target location. The beam delivery system includes a beam expansion system that includes a curved mirror having a reflective surface that is an off-axis segment of an elliptic paraboloid.

Implementations can include one or more of the following features. For example, the EUV light system can include an extreme ultraviolet light vacuum chamber within which the target location is positioned, the chamber housing an extreme ultraviolet light collector configured to collect extreme ultraviolet light emitted from the target material when the amplified light beam crosses the target location and strikes the target material.

The target material delivery system can include a target material outlet capable of outputting the target material along a target material path that crosses the target location.

The curved mirror can be a diverging curved mirror. In this case, the EUV light system can also include a converging lens. The curved mirror can receive the amplified light beam from the drive laser system, and the converging lens can receive the diverging light beam reflected off the curved mirror and substantially collimate the light beam into a collimated amplified light beam having a cross section that is larger than the cross section of the amplified light beam impinging upon the curved mirror. The converging lens can be made of diamond.

The curved mirror can be a converging curved mirror. In this case, the EUV light system can also include a diverging lens. The diverging lens can receive the amplified light beam from the drive laser system. The converging mirror can receive the diverging light beam transmitted through the diverging lens and reflect a substantially collimated amplified light beam having a cross section that is larger than the cross section of the amplified light beam impinging upon the diverging lens. The diverging lens can be made of diamond.

The EUV light system can include another curved mirror having a reflective surface that is an off-axis segment of an elliptic paraboloid. The curved mirror can be a diverging curved mirror that receives the amplified light beam from the drive laser system, and the other curved mirror can be a converging curved mirror that is placed to receive the diverging light beam reflected off the curved mirror and to substantially collimate the light beam into a collimated amplified light beam having a cross section that is larger than the cross section of the amplified light beam impinging upon the curved mirror.

The curved mirror can include a copper substrate and the reflective surface can include a highly reflective coating applied to the copper substrate. The coating can reflect light at the wavelength of the amplified light beam.

In another general aspect, an extreme ultraviolet light system includes a drive laser system that produces an amplified light beam; a target material delivery system configured to produce a target material at a target location; and a beam delivery system that is configured to receive the amplified light beam emitted from the drive laser system and to direct the amplified light beam toward the target location. The beam delivery system includes a beam expansion system that includes at least one curved mirror that expands a size of the amplified light beam, and a focusing element that includes a converging lens configured and arranged to focus the amplified light beam at the target location.

Implementations can include one or more of the following features. For example, the converging lens can include one or more aspheric surfaces. The converging lens can be a meniscal lens. The converging lens can be made of zinc selenide. The converging lens can include an anti-reflective coating and transmit at least 95% of the light at the wavelength of the amplified light beam.

The EUV light system can include an extreme ultraviolet light vacuum chamber within which the target location is positioned, the chamber housing an extreme ultraviolet light collector configured to collect extreme ultraviolet light emitted from the target material when the amplified light beam crosses the target location and strikes the target material. The converging lens can be inside the light chamber. The converging lens can be a window of the light chamber that provides a leak tight barrier between the vacuum within the light chamber and an external environment. The converging lens can have a numerical aperture of at least 0.1.

The beam delivery system can include an actuation system mechanically coupled to the converging lens and configured to move the converging lens to focus the amplified light beam to the target location.

The beam delivery system can include a metrology system that detects the amplified light beam reflected at the converging lens. The EUV light system can include a controller connected to the metrology system and to the actuation system coupled to the converging lens. The controller can be configured to move the converging lens based on the output from the metrology system. The beam delivery system can include a pre-lens mirror that redirects the amplified light beam from the expansion system toward the converging lens. The pre-lens mirror can be coupled to a mirror actuation system that is connected to the controller to permit movement of the mirror based on the output from the metrology system.

The target material delivery system can include a target material outlet capable of outputting the target material along a target material path that crosses the target location.

In another general aspect, extreme ultraviolet light is produced by producing a target material at a target location; supplying pump energy to a gain medium of at least one optical amplifier in a drive laser system to produce an amplified light beam; expanding a transverse cross sectional area of the amplified light beam; and focusing the expanded amplified light beam onto the target location by directing the expanded amplified light beam through a converging lens.

Implementations can include one or more of the following features. For example, extreme ultraviolet light emitted from the target material when the amplified light beam crosses the target location and strikes the target material can be collected.

The converging lens can be moved to focus the amplified light beam to the target location based on an analysis of light reflected off the converging lens.

The expanded amplified light beam can be reflected off a pre-lens mirror that redirects the expanded amplified light beam toward the converging lens. The pre-lens mirror can be moved based on an analysis of light reflected off the converging lens.

In another general aspect, an extreme ultraviolet light system includes a drive laser system that produces an amplified light beam; a target material delivery system configured to produce a target material at a target location; an extreme ultraviolet light vacuum chamber defining an interior space that is configured to be evacuated to sub-atmospheric pressure, a beam delivery system that is configured to receive the amplified light beam emitted from the drive laser system and to direct the amplified light beam toward the target location. The vacuum chamber houses within the interior space an extreme ultraviolet light collector configured to collect extreme ultraviolet light emitted from the target material when the amplified light beam crosses the target location and strikes the target material. The target location is in the interior space of the vacuum chamber. The beam delivery system includes a beam expansion system that expands a size of the amplified light beam, and a focusing element that includes a converging lens configured and arranged to focus the amplified light beam at the target location. The focusing element forms a pressure-resistant window of the vacuum chamber to separate the interior space from an exterior space.

In another general aspect, an extreme ultraviolet light system includes a drive laser system that produces an amplified light beam; a target material delivery system configured to produce a target material at a target location; a mirror that receives the amplified light beam and redirects the amplified light beam, and a focusing element that includes a converging lens configured and arranged to focus the redirected amplified light beam at the target location. The mirror includes a feature that separates a diagnostic portion of light reflected from a surface of the converging lens from the amplified light beam and directs the separated diagnostic light portion to a metrology system that is configured to analyze properties of the amplified light beam based on the collected separated diagnostic light portion.

Implementations can include one or more of the following features. For example, the mirror and the focusing element can be a part of a beam delivery system that is configured to receive the amplified light beam emitted from the drive laser system and to direct the amplified light beam toward the target location. The beam delivery system can include a set of optical components that change one or more of a direction and a wavefront of the amplified light beam before directing the amplified light beam toward the mirror.

The mirror feature can be an opening defined within a central region of the mirror. The mirror feature can be a facet defined at a central region of the mirror.

In another general aspect, extreme ultraviolet light is produced by receiving a measured light parameter associated with extreme ultraviolet light emitted from a target material at a target location when an amplified light beam from a laser system strikes the target material; receiving an image of a diagnostic extreme ultraviolet light portion reflected off the target material at the target location; receiving an image of a diagnostic amplified light portion that is reflected off a converging lens that focuses the amplified light beam to the target location to strike the target material; analyzing the received measured light parameter, the received diagnostic extreme ultraviolet light portion image, and the received diagnostic amplified light portion image; and controlling one or more of components within a beam transport system placed between the laser system and the target location to adjust a relative position between the amplified light beam and the target location to thereby increase an amount of extreme ultraviolet light produced when the amplified light beam strikes the target material based on the analysis.

Implementations can include one or more of the following features. For example, the one or more of components within the beam transport system can be controlled by adjusting one or more of a position of the converging lens and a position of one or more mirrors within the beam transport system. The position of one or more mirrors within the beam transport system can be adjusted by adjusting a mirror that includes a feature that separates the diagnostic amplified light portion from the amplified light beam. An image of a diagnostic portion of a guide laser beam that is directed to the target location can be received, and the received diagnostic amplified light portion image can be analyzed by analyzing the diagnostic guide laser beam portion image.

In another general aspect, extreme ultraviolet light is produced by producing a target material at a target location; supplying pump energy to a gain medium of at least one optical amplifier in a drive laser system to produce an amplified light beam; expanding a transverse cross sectional area of the amplified light beam by directing the amplified light beam through a beam expansion system that includes impinging the amplified light beam upon a curved mirror having a reflective surface that is an off-axis segment of an elliptic paraboloid; and delivering the expanded amplified light beam to the target location.

Implementations can include one or more of the following features. For example, extreme ultraviolet light emitted from the target material at the target location can be collected when the amplified light beam crosses the target location and strikes the target material. The target material can be outputted along a target material path that crosses the target location.

The curved mirror can be a diverging curved mirror, and the amplified light beam can be directed through the beam expansion system by causing the amplified light beam to diverge by reflection off the diverging curved mirror and by collimating the diverging amplified light beam with another curved mirror having a reflective surface that is an off-axis segment of an elliptic paraboloid.

DRAWING DESCRIPTION

DESCRIPTION

Figure 1:
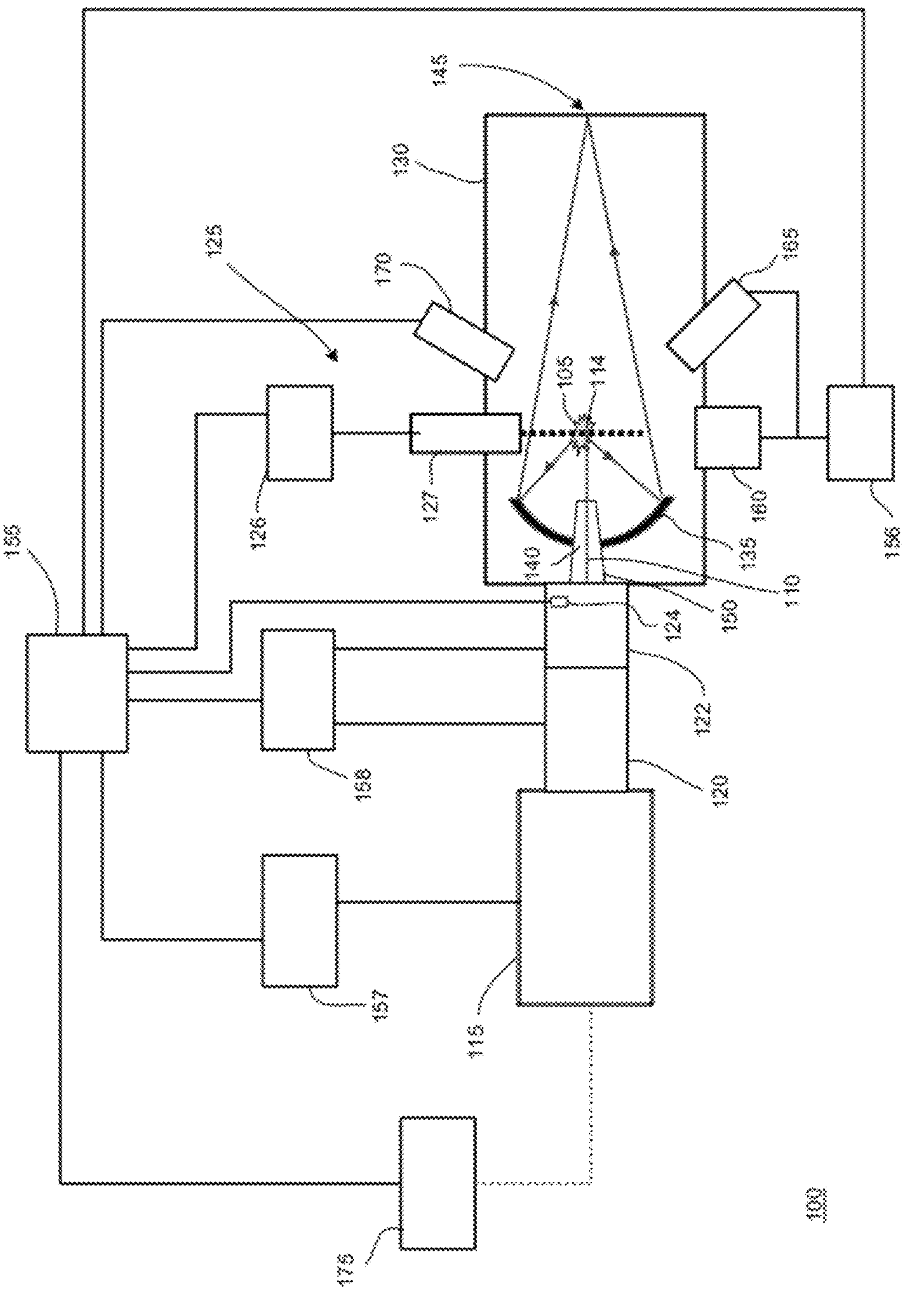
FIG. 1 is a block diagram of a laser produced plasma extreme ultraviolet light source.

Referring to FIG. 1, an LPP EUV light source 100 is formed by irradiating a target material 114 at a target location 105 within a vacuum chamber 130 with an amplified light beam 110 to convert the target material into a plasma state that has an element with an emission line in the EUV range. The light source 100 includes a drive laser system 115 that produces the amplified light beam due to a population inversion within the gain medium or mediums of the laser system 115.

The light source 100 also includes a beam delivery system between the laser system 115 and the target location 105, the beam delivery system including a beam transport system 120 and a focus assembly 122. The beam transport system 120 receives the amplified light beam 110 from the laser system 115, and steers and modifies the amplified light beam 110 as needed and outputs the amplified light beam 110 to the focus assembly 122. The focus assembly 122 receives the amplified light beam 110 and focuses the beam 110 to the target location 105.

As discussed below, the beam transport system 120 includes, among other components, at least one mirror that has a reflective surface shape that is an off-axis segment of paraboloid of revolution. Such a design enables the beam 110 to be expanded between the laser system 115 and the focus assembly 122. As also discussed below, the focus assembly 122 includes, among other components, a lens or mirror that focuses the beam 110 onto the target location 105. Before providing details about the beam transport system 120 and the focus assembly 122, a general description of the light source 100 is provided with reference to FIG. 1.

The light source 100 includes a target material delivery system 125, for example, delivering the target material 114 in the form of liquid droplets, a liquid stream, solid particles or clusters, solid particles contained within liquid droplets or solid particles contained within a liquid stream. The target material 114 can include, for example, water, tin, lithium, xenon, or any material that, when converted to a plasma state, has an emission line in the EUV range. For example, the element tin can be used as pure tin (Sn), as a tin compound, for example, $SnBr_4$, $SnBr_2$, $SnH_4$, as a tin alloy, for example, tin-gallium alloys, tin-indium alloys, tin-indium-gallium alloys, or any combination of these alloys. The target material 114 can include a wire coated with one of the above elements, such as tin. If the target material is in a solid state, it can have any suitable shape, such as a ring, a sphere, or a cube. The target material 114 can be delivered by the target material delivery system 125 into the interior of a chamber 130 and to the target location 105. The target location 105 is also referred to as an irradiation site, the place where the target material 114 is irradiated by the amplified light beam 110 to produce plasma.

In some implementations, the laser system 115 can include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 115 produces an amplified light beam 110 due to the population inversion in the gain media of the laser amplifiers even if there is no laser cavity. Moreover, the laser system 115 can produce an amplified light beam 110 that is a coherent laser beam if there is a laser cavity to provide enough feedback to the laser system 115. The term "amplified light beam" encompasses one or more of: light from the laser system 115 that is merely amplified but not necessarily a coherent laser oscillation and light from the laser system 115 that is amplified and is also a coherent laser oscillation.

The optical amplifiers in the laser system 115 can include as a gain medium a filling gas that includes $CO_2$ and can amplify light at a wavelength of between about 9100 and about 11000 nm, and in particular, at about 10600 nm, at a gain greater than or equal to 1000. Suitable amplifiers and lasers for use in the laser system 115 can include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 50 kHz or more. The optical amplifiers in the laser system 115 can also include a cooling system such as water that can be used when operating the laser system 115 at higher powers.

Figure 2A:
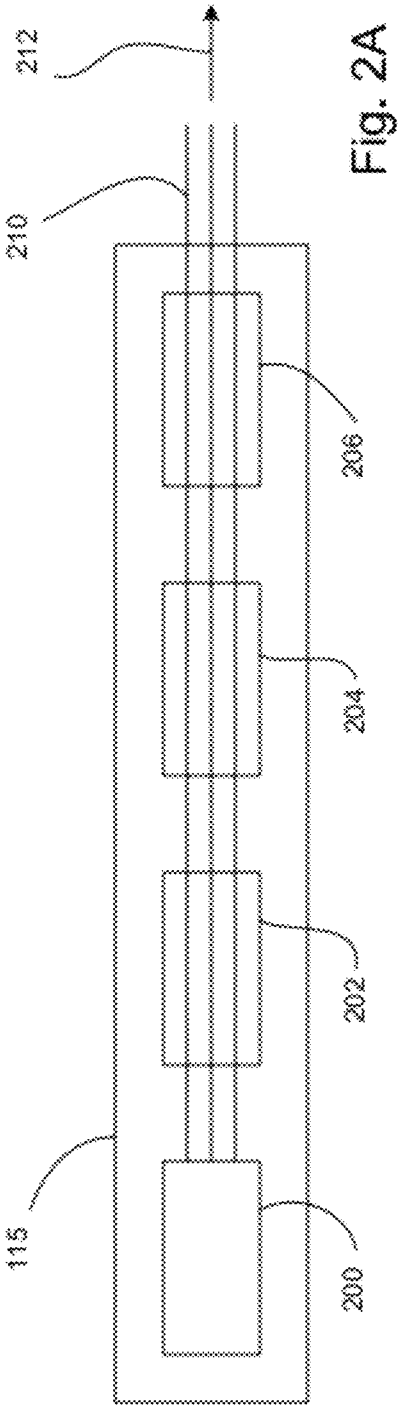
FIG. 2A is a block diagram of an exemplary drive laser system that can be used in the light source of FIG. 1.

Referring to FIG. 2A, in one particular implementation, the laser system 115 has a master oscillator/power amplifier (MOPA) configuration with multiple stages of amplification and having a seed pulse that is initiated by a Q-switched master oscillator (MO) 200 with low energy and high repetition rate, for example, capable of 100 kHz operation. From the MO 200, the laser pulse can be amplified, for example, using RF pumped, fast axial flow, $CO_2$ amplifiers 202, 204, 206 to produce an amplified light beam 210 traveling along a beam path 212.

Although three optical amplifiers 202, 204, 206 are shown, it is possible that as few as one amplifier and more than three amplifiers could be used in this implementation. In some implementations, each of the $CO_2$ amplifiers 202, 204, 206 can be an RF pumped axial flow $CO_2$ laser cube having a 10 meter amplifier length that is folded by internal mirrors.

Figure 2B:
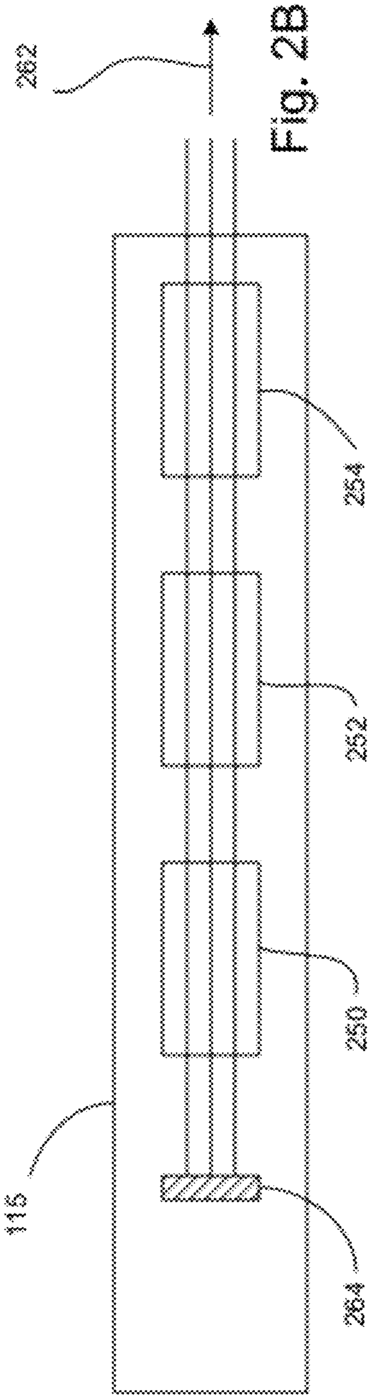
FIG. 2B is a block diagram of an exemplary drive laser system that can be used in the light source of FIG. 1.

Alternatively, and with reference to FIG. 2B, the drive laser system 115 can be configured as a so-called "self-targeting" laser system in which the target material 114 serves as one mirror of the optical cavity. In some "self-targeting" arrangements, a master oscillator may not be required. The laser system 115 includes a chain of amplifier chambers 250, 252, 254, arranged in series along a beam path 262, each chamber having its own gain medium and excitation source, for example, pumping electrodes. Each amplifier chamber 250, 252, 254, can be an RF pumped, fast axial flow, $CO_2$ amplifier chamber having a combined one pass gain of, for example, 1,000-10,000 for amplifying light of a wavelength λ of, for example, 10600 nm. Each of the amplifier chambers 250, 252, 254 can be designed without laser cavity (resonator) mirrors so that when set up alone they do not include the optical components needed to pass the amplified light beam through the gain medium more than once. Nevertheless, as mentioned above, a laser cavity can be formed as follows.

In this implementation, a laser cavity can be formed by adding a rear partially reflecting optic 264 to the laser system 115 and placing the target material 114 at the target location 105. The optic 264 can be, for example, a flat mirror, a curved mirror, a phase-conjugate mirror, or a corner reflector having a reflectivity of about 95% for wavelengths of about 10600 nm (the wavelength of the amplified light beam 110 if $CO_2$ amplifier chambers are used).

The target material 114 and the rear partially reflecting optic 264 act to reflect some of the amplified light beam 110 back into the laser system 115 to form the laser cavity. Thus, the presence of the target material 114 at the target location 105 provides enough feedback to cause the laser system 115 to produce coherent laser oscillation and in this case, the amplified light beam 110 can be considered a laser beam. When the target material 114 isn't present at the target location 105, the laser system 115 may still be pumped to produce the amplified light beam 110 but it would not produce a coherent laser oscillation unless some other component within the source 100 provides enough feedback. In particular, during the intersection of the amplified light beam 110 with the target material 114, the target material 114 may reflect light along the beam path 262, cooperating with the optic 264 to establish an optical cavity passing through the amplifier chambers 250, 252, 254. The arrangement is configured so the reflectivity of the target material 114 is sufficient to cause optical gains to exceed optical losses in the cavity (formed from the optic 264 and the droplet) when the gain medium within each of the chambers 250, 252, 254 is excited generating a laser beam for irradiating the target material 114, creating a plasma, and producing an EUV light emission within the chamber 130. With this arrangement, the optic 264, amplifiers 250, 252, 254, and the target material 114 combine to form a so-called "self-targeting" laser system in which the target material 114 serves as one mirror (a so-called plasma mirror or mechanical q-switch) of the optical cavity. Self-targeting laser systems are disclosed in U.S. application Ser. No. 11/580,414 filed on Oct. 13, 2006 entitled, Drive Laser Delivery Systems for EUV Light Source, the entire contents of which are hereby incorporated by reference herein.

Depending on the application, other types of amplifiers or lasers can also be suitable, for example, an excimer or molecular fluorine laser operating at high power and high pulse repetition rate. Examples include a solid state laser, for example, having a fiber or disk shaped gain medium, a MOPA configured excimer laser system, as shown, for example, in U.S. Pat. Nos. 6,625,191; 6,549,551; and 6,567,450; an excimer laser having one or more chambers, for example, an oscillator chamber and one or more amplifying chambers (with the amplifying chambers in parallel or in series); a master oscillator/power oscillator (MOPO) arrangement, a power oscillator/power amplifier (POPA) arrangement; or a solid state laser that seeds one or more excimer or molecular fluorine amplifier or oscillator chambers, may be suitable. Other designs are possible.

At the irradiation site, the amplified light beam 110, suitably focused by the focus assembly 122, is used to create plasma having certain characteristics that depend on the composition of the target material 114. These characteristics can include the wavelength of the EUV light produced by the plasma and the type and amount of debris released from the plasma.

The light source 100 includes a collector mirror 135 having an aperture 140 to allow the amplified light beam 110 to pass through and reach the target location 105. The collector mirror 135 can be, for example, an ellipsoidal mirror that has a first focus at the target location 105 and a second focus at an intermediate location 145 (also called an intermediate focus) where the EUV light can be output from the light source 100 and can be input to, for example, an integrated circuit lithography tool (not shown). The light source 100 can also include an open-ended, hollow conical shroud 150 (for example, a gas cone) that tapers toward the target location 105 from the collector mirror 135 to reduce the amount of plasma-generated debris that enters the focus assembly 122 and/or the beam transport system 120 while allowing the amplified light beam 110 to reach the target location 105. For this purpose, a gas flow can be provided in the shroud that is directed toward the target location 105.

The light source 100 can also include a master controller 155 that is connected to a droplet position detection feedback system 156, a laser control system 157, and a beam control system 158. The light source 100 can include one or more target or droplet imagers 160 that provide an output indicative of the position of a droplet, for example, relative to the target location 105 and provide this output to the droplet position detection feedback system 156, which can, for example, compute a droplet position and trajectory from which a droplet position error can be computed either on a droplet by droplet basis or on average. The droplet position detection feedback system 156 thus provides the droplet position error as an input to the master controller 155. The master controller 155 can therefore provide a laser position, direction, and timing correction signal, for example, to the laser control system 157 that can be used, for example, to control the laser timing circuit and/or to the beam control system 158 to control an amplified light beam position and shaping of the beam transport system 120 to change the location and/or focal power of the beam focal spot within the chamber 130.

The target material delivery system 125 includes a target material delivery control system 126 that is operable in response to a signal from the master controller 155, for example, to modify the release point of the droplets as released by a delivery mechanism 127 to correct for errors in the droplets arriving at the desired target location 105.

Additionally, the light source 100 can include a light source detector 165 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 165 generates a feedback signal for use by the master controller 155. The feedback signal can be, for example, indicative of the errors in parameters such as the timing and focus of the laser pulses to properly intercept the droplets in the right place and time for effective and efficient EUV light production.

The light source 100 also includes a guide laser 175 that can be used to align various sections of the light source 100 or to assist in steering the amplified light beam 110 to the target location 105. In connection with the guide laser 175, the light source 100 includes a metrology system 124 that is placed within the focus assembly 122 to sample a portion of light from the guide laser 175 and the amplified light beam 110. In other implementations, the metrology system 124 is placed within the beam transport system 120.

The metrology system 124 can include an optical element that samples or re-directs a subset of the light, such optical element being made out of any material that can withstand the powers of the guide laser beam and the amplified light beam 110. For example, the sample optical element within the metrology system 124 can include a substrate made of zinc selenide (ZnSe) that is coated with an anti-reflection coating. The sample optical element within the metrology system 124 can be a diffraction grating positioned at an angle relative to the longitudinal direction of the amplified light beam 110 to decouple some light from the amplified light beam 110 and from the guide laser 175 for diagnostic purposes. Because the wavelengths of the amplified light beam 110 and beam of the guide laser 175 are distinct from each other, they can be directed away from the diffraction grating at separate angles to enable separation of the beams. A beam analysis system is formed from the metrology system 124 and the master controller 155 since the master controller 155 analyzes the sampled light from the guide laser 175 and uses this information to adjust components within the focus assembly 122 through the beam control system 158. In other implementations, the metrology system 124 includes one or more dichroic mirrors placed within the focus assembly 122 to separate the amplified light beam 110 from the guide laser 175 and to provide for separate analyses. Such a metrology system is described in "Metrology System for Extreme Ultra-Violet Light Source", filed concurrently with this application Ser. No. 12/637,961, which is incorporated herein by reference in its entirety.

Thus, in summary, the light source 100 produces an amplified light beam 110 that is directed at the target material at the target location 105 to convert the target material into plasma that emits light in the EUV range. The amplified light beam 110 operates at a particular wavelength that is determined based on the design and properties of the laser system 115, as will be discussed in more detail below. Additionally, the amplified light beam 110 can be a laser beam when the target material provides enough feedback back into the laser system 115 to produce coherent laser light or if the drive laser system 115 includes suitable optical feedback to form a laser cavity.

As discussed above, the drive laser system 115 includes one or more optical amplifiers and several optical components (for example, about 20 to 50 mirrors), the beam transport system 120 and the focus assembly 122 include several optical components such as, for example, mirrors, lenses, and prisms. All of these optical components have a wavelength range that encompasses the wavelength of the amplified light beam 110 to permit efficient formation of the amplified light beam 110 and output of the amplified light beam 110 to the target location 105. Additionally, one or more of the optical components can be formed with a multilayer dielectric anti-reflective interference coating on a substrate.

Figure 3:
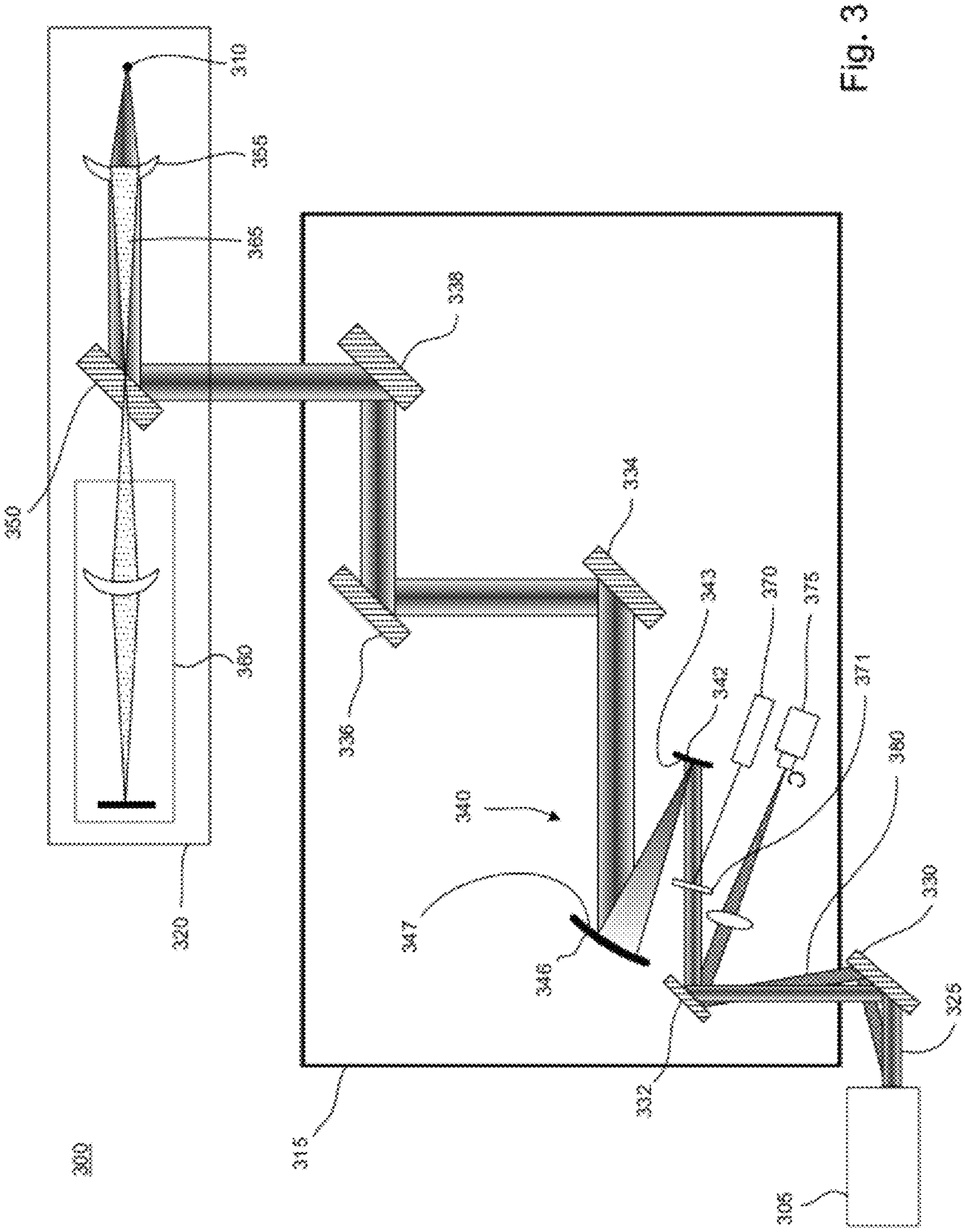
FIG. 3 is a block diagram of an exemplary beam delivery system positioned between a drive laser system and a target location of the light source of FIG. 1.

Referring to FIG. 3, an exemplary beam delivery system 300 is positioned between a drive laser system 305 and a target location 310, the beam delivery system including a beam transport system 315 and a focus assembly 320. The beam transport system 315 receives an amplified light beam 325 produced by the drive laser system 305, redirects and expands the amplified light beam 325, and then directs the expanded, redirected amplified light beam 325 toward the focus assembly 320. The focus assembly 320 focuses the amplified light beam 325 to the target location 310.

The beam transport system 315 includes a set of mirrors 330, 332, 334, 336, and 338 (which are sometimes referred to as fold mirrors) that change the direction of the amplified light beam 325. The fold mirrors 330, 332, 334, 336, 338 can be made of any substrates and coatings that are suitable for reflecting the amplified light beam 325. Thus, they can be made of substrates and coatings that are selected to reflect most light at the wavelength of the amplified light beam 325. In some implementations, one or more of the fold mirrors 330, 332, 334, 336, 338 are made of a highly reflective coating such as maximum metal reflector (MMR) coating produced by II-VI Infrared of Saxonburg, Pa. over an oxygen-free high conductivity (OFHC) copper substrate. Other coatings that can be used for the fold mirrors 330, 332, 334, 336, 338 include gold and silver, and other substrates to which the coating can be applied include silicon, molybdenum, and aluminum. One or more of the fold mirrors 330, 332, 334, 336, 338 can be water cooled, for example, by flowing water or some other appropriate coolant through their substrates.

The beam transport system 315 also includes a beam expansion system 340 that expands the amplified light beam 325 such that the transverse size of the amplified light beam 325 that exits the beam expansion system 340 is larger than the transverse size of the amplified light beam 325 that enters the beam expansion system 340. The beam expansion system 340 includes at least a curved mirror that has a reflective surface that is an off-axis segment of an elliptic paraboloid (such a mirror is also referred to as an off-axis paraboloid mirror). The beam expansion system 340 can include other optical components that are selected to redirect and expand or collimate the amplified light beam 325. Various designs for the beam expansion system 340 are described below with respect to FIGS. 3, 4A-C, 5A-C, and 6.

As shown in FIG. 3, the beam expansion system 340 includes a first curved mirror 342 that has a reflective surface 343 that is an off-axis segment of an elliptic paraboloid and a second curved mirror 346 that has a reflective surface 347 that is an off-axis segment of an elliptic paraboloid. The shapes of the curved mirrors 342, 346 are selected to be complementary to each other and the relative placement of the curved mirrors 342, 346 is adjusted to increase the collection efficiency of the amplified light beam 325. More detail about the curved mirrors 342, 346 is provided below when discussing FIGS. 4A-C and 5A-C, respectively.

As also shown in FIG. 3, the focus assembly 320 includes a final fold mirror 350 and a focusing element that includes a converging lens 355 configured and arranged to focus the amplified light beam 325 reflected from the mirror 350 to the target location 310. The final fold mirror 350 can be made of a substrate having a coating that is highly reflective at the wavelength of the amplified light beam 325. For example, the mirror 350 can have a maximum metal reflector (MMR) coating produced by II-VI Infrared of Saxonburg, Pa. over an oxygen-free high conductivity (OFHC) copper substrate. Other coatings that can be used for the mirror 350 include gold and silver, and other substrates to which the coating can be applied include silicon, molybdenum, and aluminum. The lens 355 is made of a material that can transmit at the wavelength of the amplified light beam 325. In some implementations, the lens 355 is made of ZnSe. Details of the converging lens 355 are provided when discussing FIGS. 7-9.

The focus assembly 320 can also include a metrology system 360 that captures light 365 reflected from the lens 355. This captured light can be used to analyze properties of the amplified light beam 325 and light from the guide laser 175, for example, to determine a position of the amplified light beam 325 and monitor changes in a focal length of the amplified light beam 325. Specifically, the captured light can be used to provide information regarding the position of the amplified light beam 325 on the lens 355, and to monitor focal length changes of the lens 355 due to changes in temperature (for example heating) of the lens 355.

The lens 355 can be a meniscus lens to enable or facilitate focusing of the amplified light beam 325 reflected from the mirror 350 to the desired position of the target location 310. Additionally, the lens 355 can include an aspheric correction on each of its surfaces to simultaneously provide a tightly focused transmitted amplified light beam 325 and a tightly focused light 365 that is reflected from the lens 355. The lens 355 can be designed with at least one surface that is an on-axis segment of a paraboloid.

Each of the fold mirrors 330, 332, 334, 336, 338 can redirect the amplified light beam 325 by any suitable angle, for example, by about 90 degrees. Additionally, at least two of the fold mirrors 330, 332, 334, 336, 338 can be movable with the use of a movable mount that is actuated by a motor that can be controlled by the master controller 155 to provide active pointing control of the amplified light beam 325 to the target location 310. The movable fold mirrors can be adjusted to maintain the position of the amplified light beam 325 on the lens 355 and the focus of the amplified light beam 325 at the target material.

The beam delivery system 300 can also include an alignment laser 370 that is used during set up to align the location and angle or position of one or more of the components (such as the fold mirrors 330, 332, 332, 334, 336, 338, the curved mirrors 342, 346, and the final fold mirror 350) of the beam delivery system 300. The alignment laser 370 can be a diode laser that operates in the visible spectrum to aid in a visual alignment of the components. The alignment laser 370 reflects off a dichroic beam combiner 371 that reflects visible light and transmits infrared light. This permits the alignment beam to propagate simultaneously with the amplified light beam.

The beam delivery system 300 can also include a detection device 375 such as a camera that monitors light reflected off the target material 114 at the target location 310, such light reflects off a front surface of the drive laser system 305 to form a diagnostic beam 380 that can be detected at the detection device 375. The detection device 375 can be connected to the master controller 155 to provide feedback on a position of the plasma along an x-axis (which is the direction of flow of the target material (for example, the droplet)). The master controller 155 can thereby adjust a position of one or more components (for example, the mirror 350 and/or the lens 355) within the beam delivery system 300 to adjust the location of the amplified light beam 325 to better coincide or overlap the target material 114.

Figures 4A, 4B, 4C:
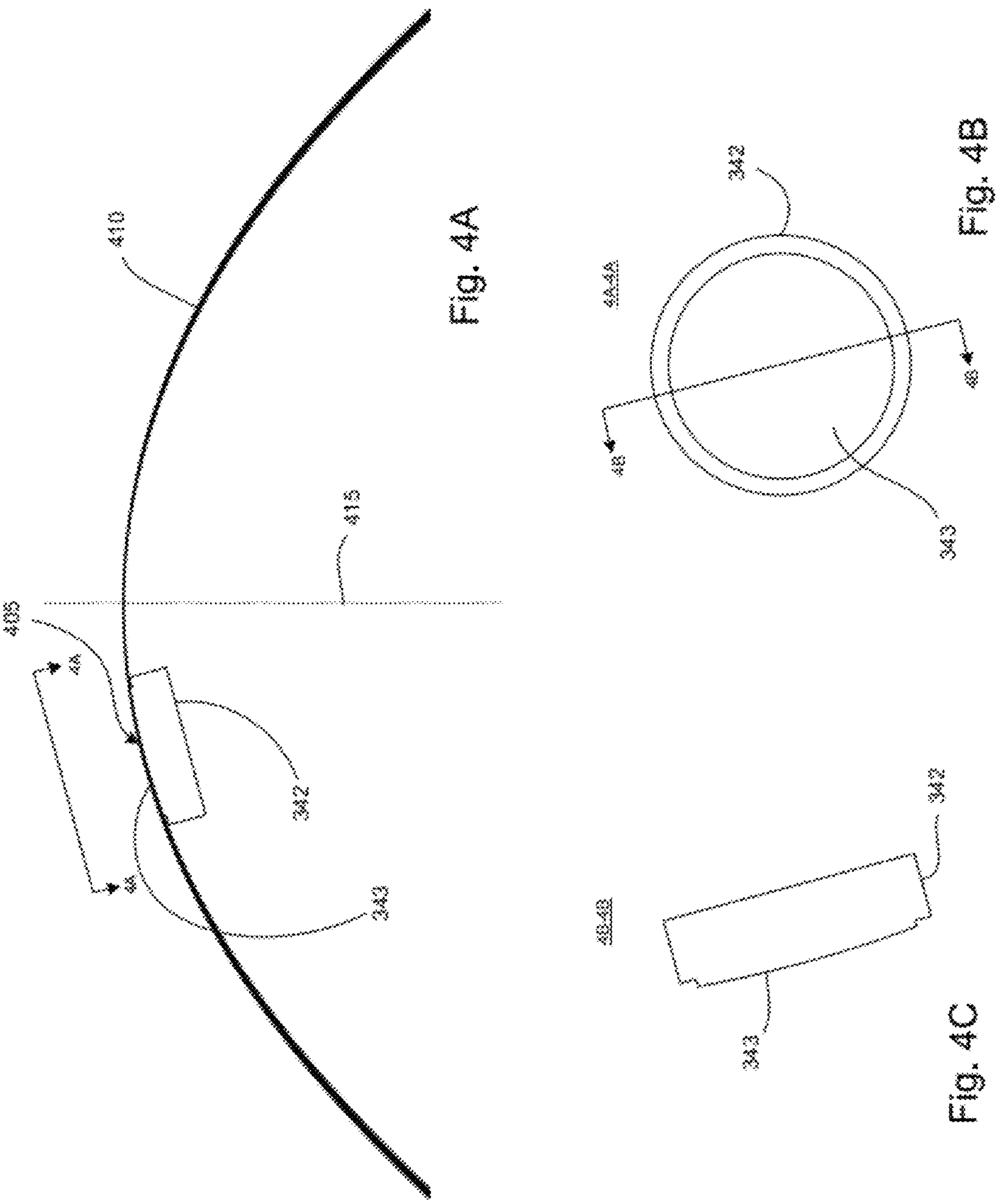
FIG. 4A is a diagram of a first curved mirror used in a beam expansion system of the beam delivery system of FIG. 3.
FIG. 4B is a plan view of the first curved mirror of FIG. 4A taken along 4A-4A.
FIG. 4C is a side cross sectional view of the first curved mirror of FIG. 4B taken along 4B-4B.

Referring also to FIGS. 4A-C, the first curved mirror 342 is a diverging mirror having a reflective surface 343 formed from a segment 405 of an elliptic paraboloid 410. The reflective surface 343 is formed from the inner surface of the paraboloid segment 405. The elliptic paraboloid 410 can be a paraboloid of revolution having an axis of rotation 415 and the segment 405 is an "off-axis segment" in that the segment 405 and the reflective surface 400 are formed from a region of the paraboloid 410 that excludes the axis of rotation 415 of the paraboloid 410. The mirror 342 (specifically, the reflective surface 343) is diverging in that it causes a collimated wavefront of the amplified light beam 325 to diverge so that the beam radius of the amplified light beam 325 reflected from the mirror 342 increases as it propagates away from the mirror 342.

The first curved mirror 342 can be made of any substrate and coating that is suitable for reflecting the amplified light beam 325. Thus, it can be made of a substrate and a coating that are selected to reflect light at the wavelength of the amplified light beam 325. The first curved mirror 342 can be cooled with a fluid coolant such as water that can flow through the substrate of the mirror 342. The reflective surface 343 of the first curved mirror 342 can be formed from a coating of maximum metal reflector (MMR) produced by II-VI Infrared of Saxonburg, Pa. over an oxygen-free high conductivity (OFHC) copper substrate.

Figure 5A:
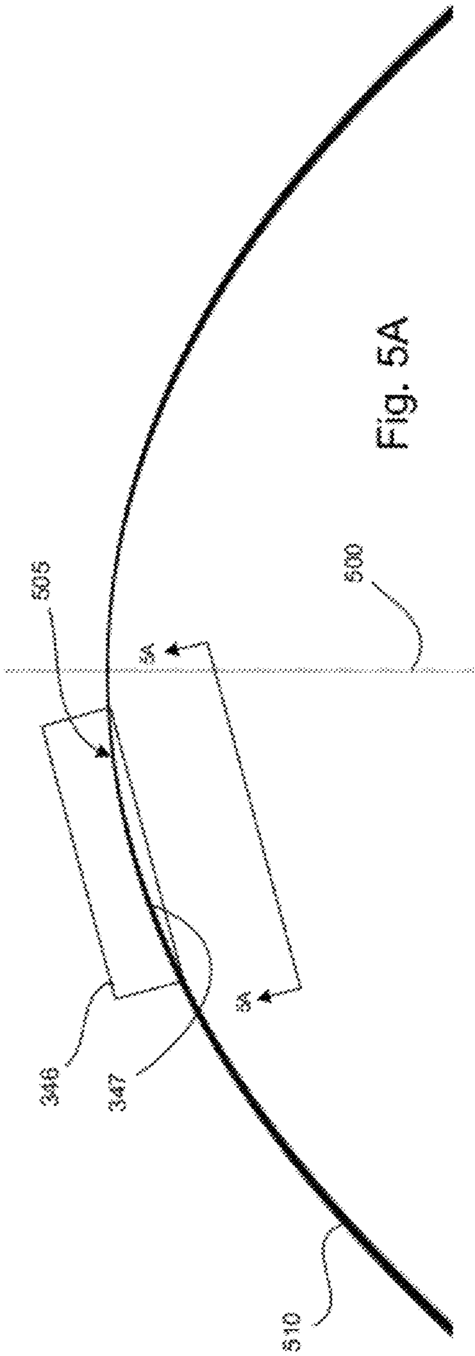
FIG. 5A is a diagram of a first curved mirror used in a beam expansion system of the beam delivery system of FIG. 3.
Figure 5B:
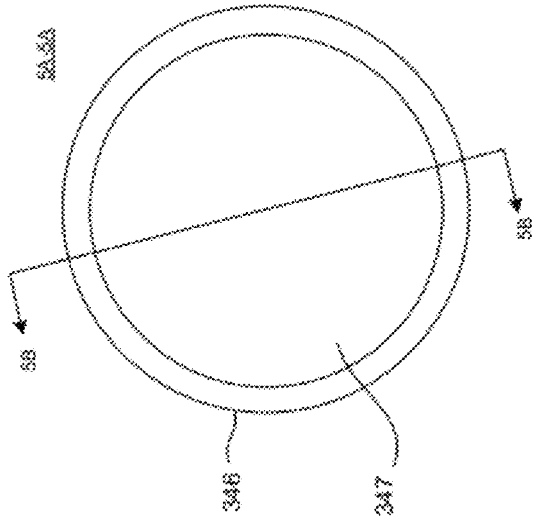
FIG. 5B is a plan view of the first curved mirror of FIG. 5A taken along 5A-5A.
Figure 5C:
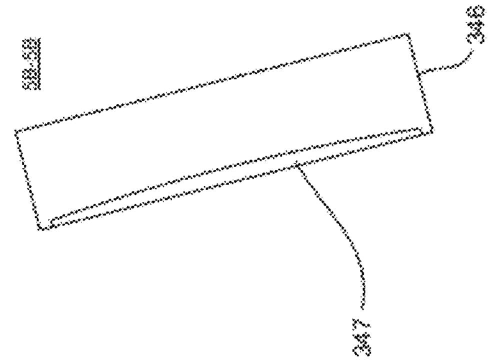
FIG. 5C is a side cross sectional view of the first curved mirror of FIG. 5B taken along 5B-5B.

Referring also to FIGS. 5A-C, the second curved mirror 346 is a converging mirror having a reflective surface 347 formed from a segment 505 of an elliptic paraboloid 510. The reflective surface 347 is formed from the outer surface of the paraboloid segment 505. The elliptic paraboloid 510 can be a paraboloid of revolution having an axis of rotation 515 and the segment 505 is therefore an "off-axis segment" in that the segment 505 and the reflective surface 500 are formed from a region of the paraboloid 510 that excludes the axis of rotation 515 of the paraboloid 510. The mirror 346 (specifically, the reflective surface 347) is converging in that it would cause a collimated wavefront of the amplified light beam 325 to converge so that the beam radius of a collimated amplified light beam 325 that is reflected from the mirror 346 would decrease as it propagates away from the mirror 346. The converging mirror 346 also causes a diverging wavefront of the amplified light beam 325 to become collimated upon reflection from the mirror 346 so that the beam radius of the diverging amplified light beam 325 that is reflected from the mirror 346 would stay the same as it propagates away from the mirror 346.

The second curved mirror 346 can be made of any substrate and coating that is suitable for reflecting the amplified light beam 325. Thus, it can be made of a substrate and a coating that are selected to reflect light at the wavelength of the amplified light beam 325. The reflective surface 347 of the second curved mirror 346 can be a maximum metal reflector (MMR) produced by II-VI Infrared of Saxonburg, Pa. over an oxygen-free high conductivity (OFHC) copper substrate. The second curved mirror 346 can be cooled with a fluid coolant such as water that can flow through the substrate of the mirror 346.

The combination of the first curved mirror 342 and the second curved mirror 346 provides a magnification of the amplified light beam 325, for example, of about 3.6×, and such magnification reduces the divergence of the beam, for example, by 3.6×. The design of the beam expansion system 340 that has at least one off-axis paraboloid mirror also enables a more compact arrangement within the beam transport system 315 when compared with prior arrangements that used spherical mirrors for beam expansion. The amplified light beam 325 can be transported over distances longer and with less divergence than would have been possible in prior beam expanders that used spherical mirrors because the beam expansion system 340 includes at least one off-axis paraboloid mirror (for example, the first curved mirror 342, the second curved mirror 346, the combination of the two mirrors 342, 346, or the combination of one of the curved mirrors 342, 346 and a lens). Moreover, the off-axis paraboloid mirror provides an improved quality wavefront (for example, reduced aberration so that the wavefront is nearer to a planar wavefront) of the amplified light beam 325 when compared with spherical mirrors that have been used in prior beam expanders.

Figure 6:
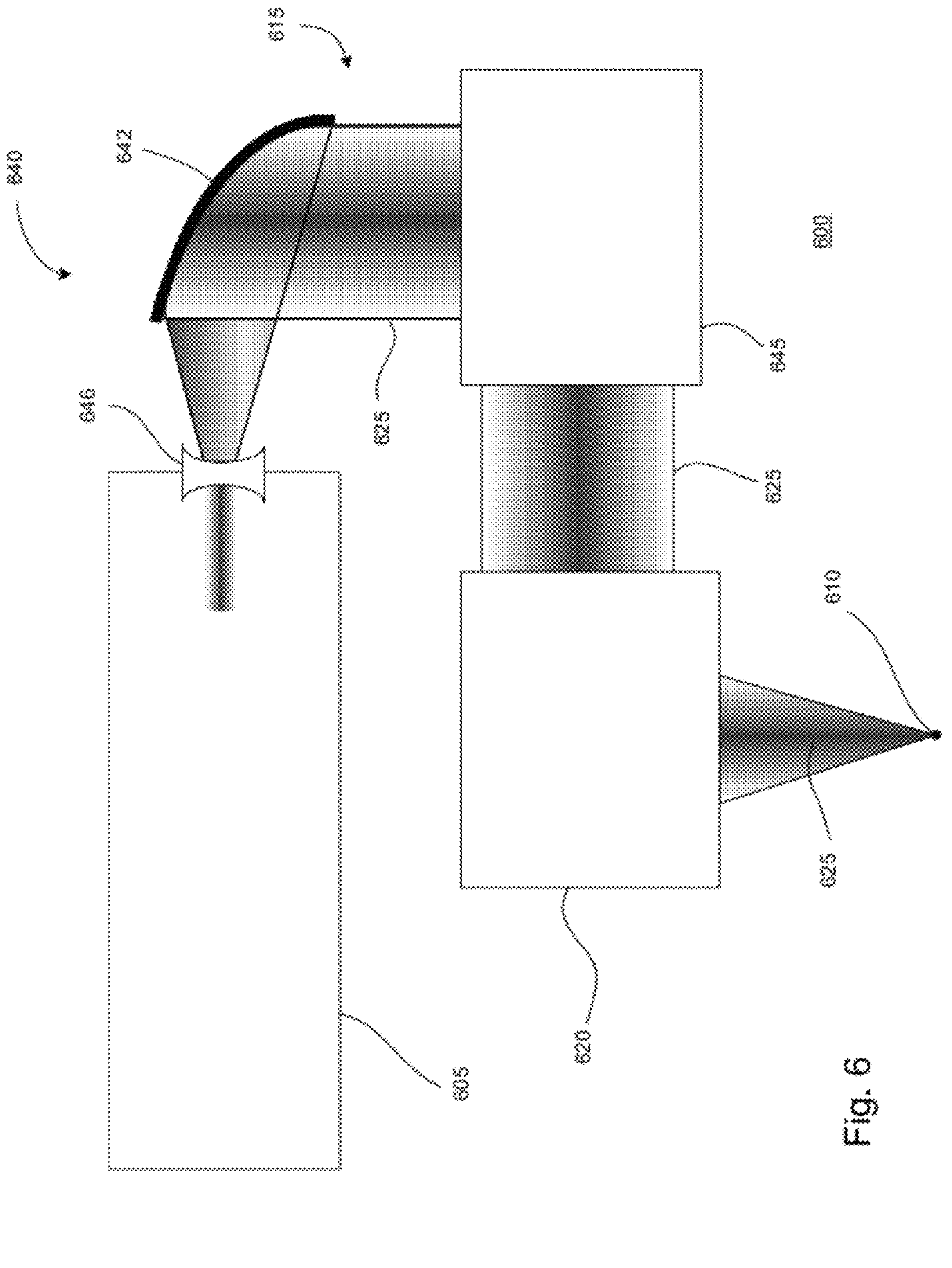
FIG. 6 is a block diagram of an exemplary beam delivery system positioned between a drive laser system and a target location of the light source of FIG. 1.

Referring to FIG. 6, in another implementation, a beam delivery system 600 is positioned between a drive laser system 605 and a target location 610. The beam delivery system 600 includes a beam transport system 615 and a focus assembly 620. The beam transport system 615 receives an amplified light beam 625 produced by the drive laser system 605, redirects and expands the amplified light beam 625, and then directs the expanded, redirected amplified light beam 625 toward the focus assembly 620, which focuses the amplified light beam 625 to the target location 610. The focus assembly 620 can include a converging lens that focuses the amplified light beam 625 to the target location 610. Such a converging lens is described in U.S. application Ser. No. 12/637,961, entitled "Metrology for Extreme Ultra-Violet Light Source" and filed on Dec. 15, 2009, which is incorporated herein by reference in its entirety.

The beam transport system 615 includes a beam expansion system 640 that expands the amplified light beam 625 and a set of additional redirecting optical components 645 such as the fold mirrors described above. The beam expansion system 640 includes a curved mirror 642 that has a reflective surface that is an off-axis segment of an elliptic paraboloid and a diverging lens 646 at the output of the drive laser system 605. The diverging lens 646 can be made of any material that transmits light at the wavelength of the amplified light beam 110 and is able to withstand heat that can accumulate due to the intensity of the amplified light beam 110. In some implementations, the diverging lens 646 is made of diamond and is polished to form the two concave surfaces. The diverging lens 646 can be configured as an output window of the drive laser system 605.

Figure 7:
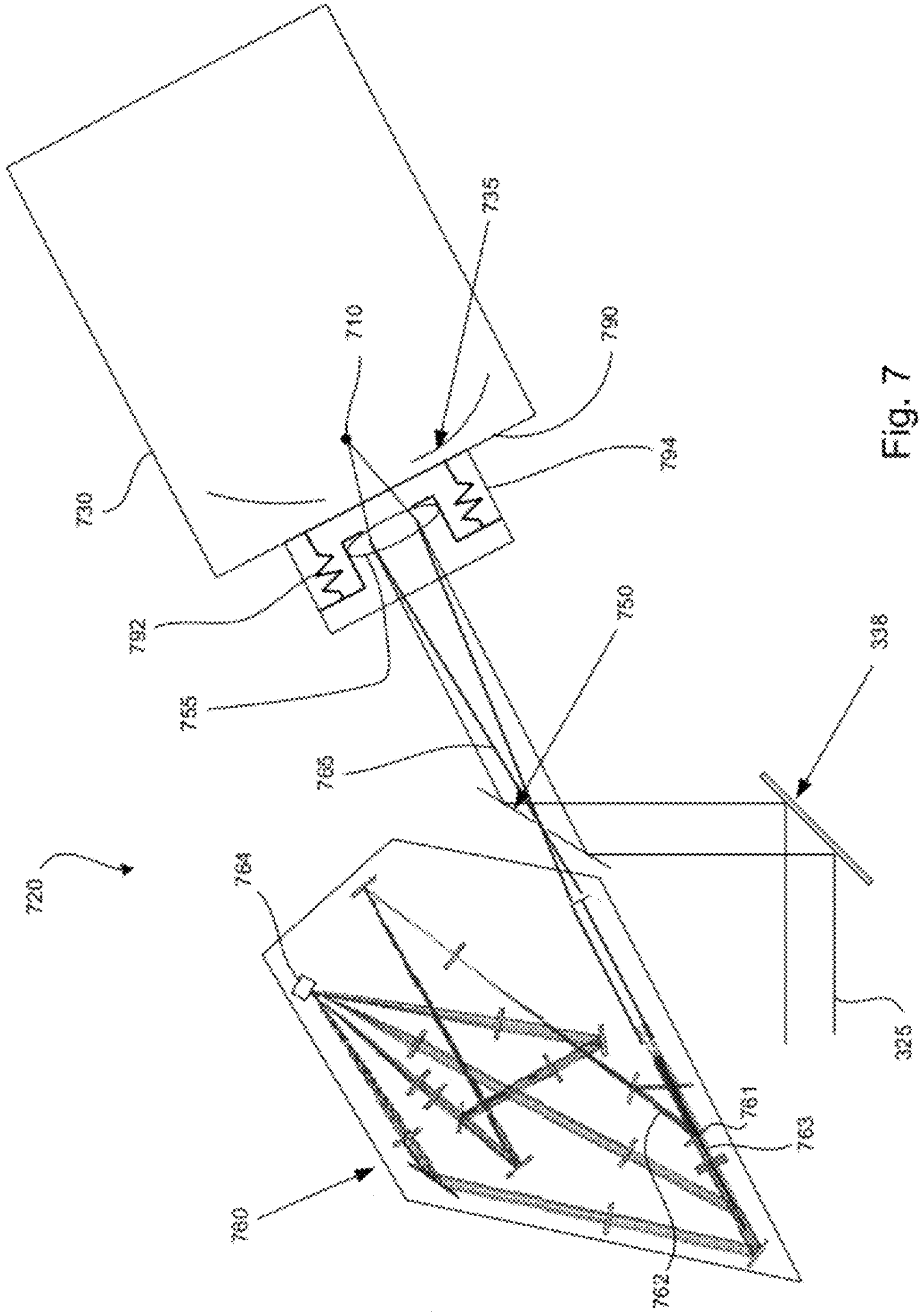
FIG. 7 is a block diagram of an exemplary converging lens that focuses light from the beam delivery system to the target location.

Referring to FIG. 7, an exemplary focus assembly 720 includes a final fold mirror 750 and a focusing element that includes a converging lens 755 configured and arranged to focus the amplified light beam 325 reflected from the mirror 750 to the target location 710 within the chamber 730. In this example, the converging lens 755 is a double convex or biconvex lens, though it can alternatively be a convex-concave lens. The lens 755 is mounted in a lens housing 794 that is mounted to a wall 790 of the chamber 730 such that an opening of the lens housing 794 aligns with an opening of the chamber wall 790 and the lens 755 acts as a window between a vacuum maintained within the chamber 730 and a purged environment external to the chamber 730. A bellows 792 can be placed between the vacuum chamber wall 790 and the housing 794 to facilitate movement of the lens 755 along one or more three directions that are relative to a direction of the light beam 325; an axial direction or longitudinal direction that extends along the direction of the light beam 325 and the two directions that are transverse to the axial direction.

The focus assembly 720 can also include a metrology system 760 that captures light 765 reflected from the lens 755 and transmitted through an opening within the central region of the mirror 750.

The extreme ultraviolet light vacuum chamber 730 houses the extreme ultraviolet light collector 735 that is configured to collect extreme ultraviolet light emitted from the target material at the target location 710 when the amplified light beam 325 crosses the target location 710 and strikes the target material.

Figure 8:
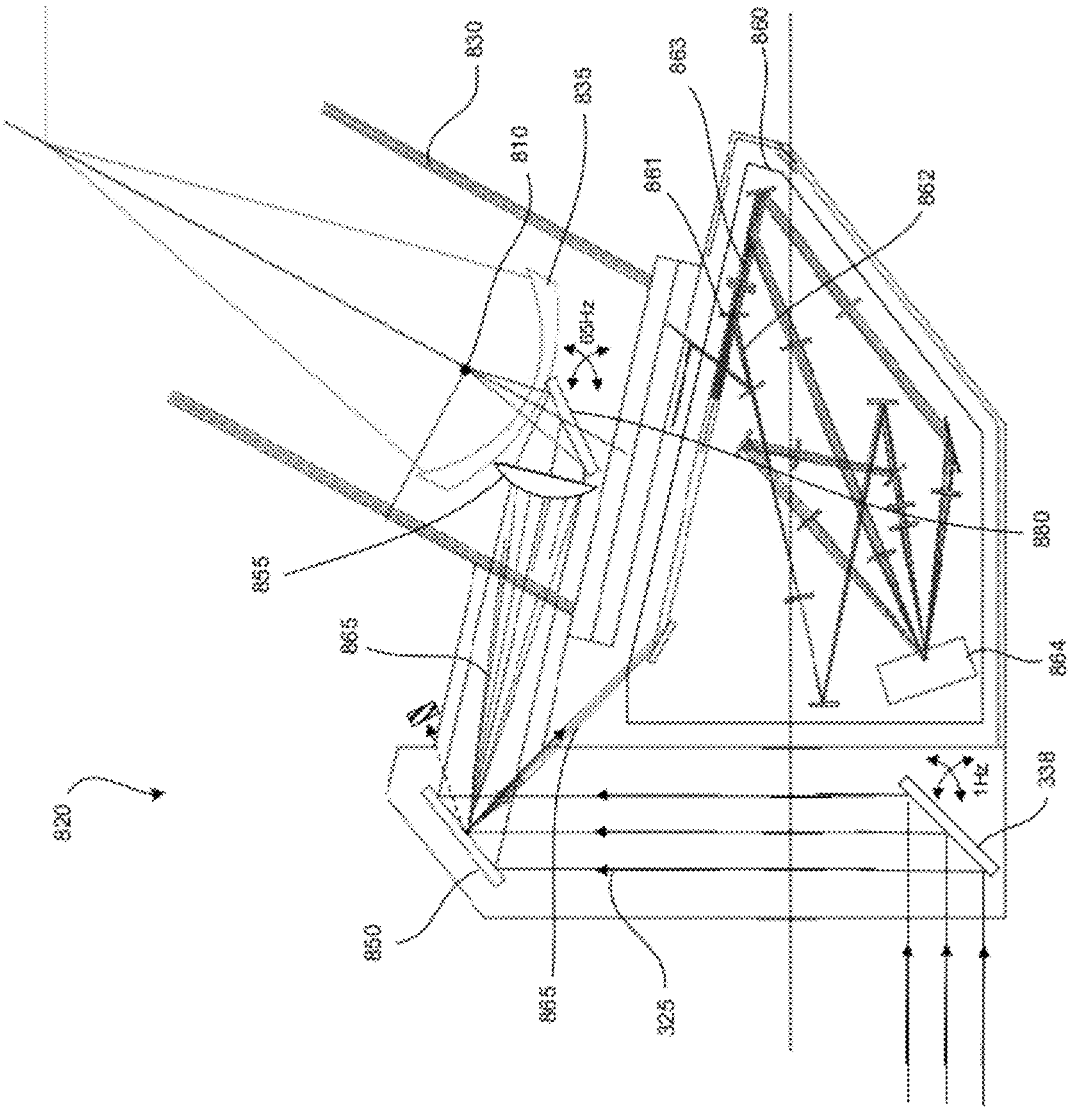
FIG. 8 is a block diagram of an exemplary converging lens that focuses light from the beam delivery system to the target location.

Referring to FIG. 8, in another implementation, a focus assembly 820 includes a final fold mirror 850 and a focusing element that includes a converging lens 855 configured and arranged to focus the amplified light beam 325 reflected from the mirror 850 to the target location 810 within the chamber 830. The focus assembly 820 also includes a movable mirror 880 positioned to redirect the focused light from the lens 855 to the target location 810. In this implementation, the converging lens 855 is a meniscus lens that is placed inside the chamber 830, but it can be a plano-convex lens. The focus assembly 820 can also include a metrology system 860 that captures light 865 reflected from the lens 855, and then reflected from an offset facet in a central region of the mirror 850 along a direction that is distinct from the direction of the amplified light beam 325.

The extreme ultraviolet light vacuum chamber 830 houses the extreme ultraviolet light collector 835 that is configured to collect extreme ultraviolet light emitted from the target material at the target location 810 when the amplified light beam 325 crosses the target location 810 and strikes the target material.

Figure 9:
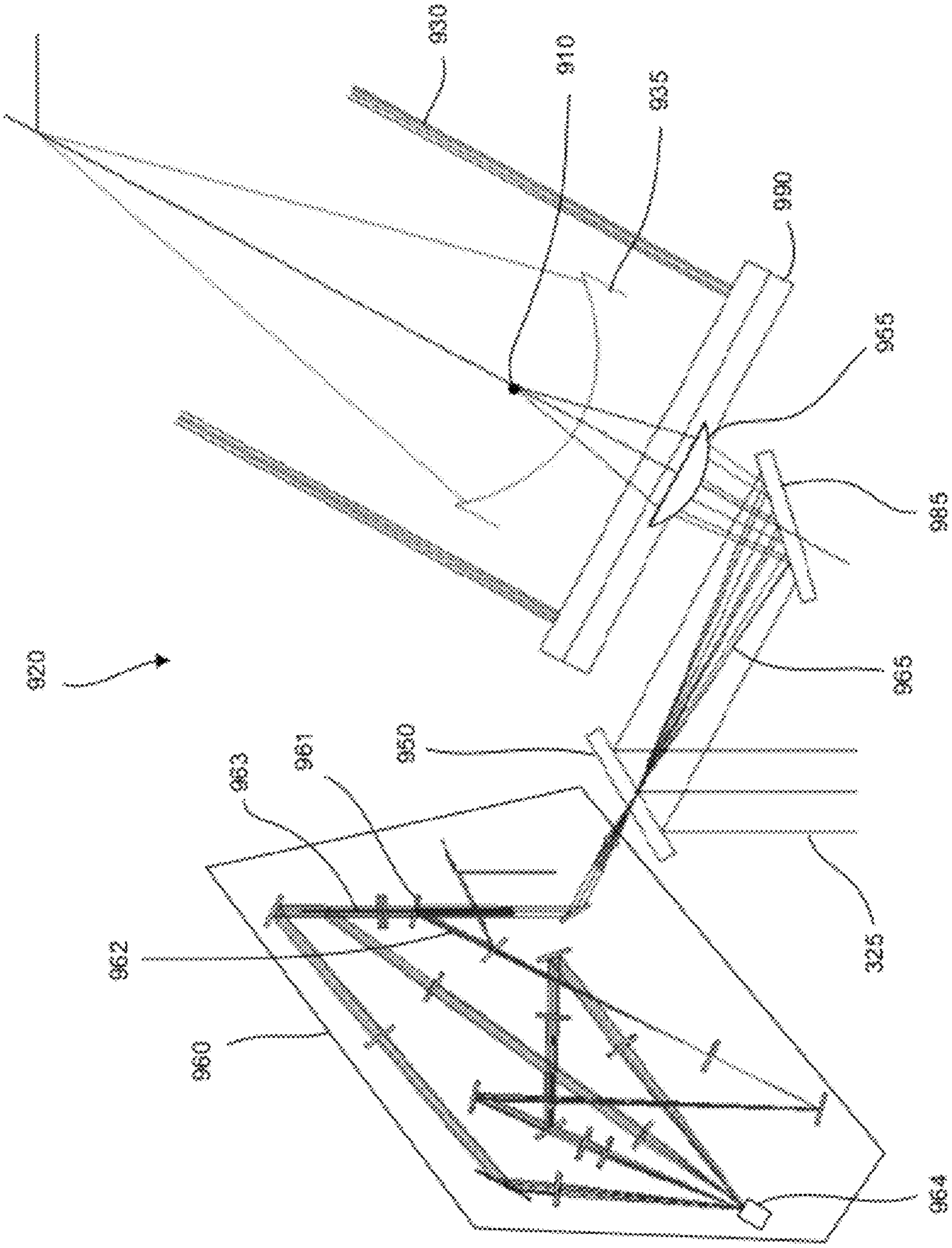
FIG. 9 is a block diagram of an exemplary converging lens that focuses light from the beam delivery system to the target location.

Referring to FIG. 9, in another implementation, a focus assembly 920 includes a final fold mirror 950 and a focusing element that includes a converging lens 955 configured and arranged to focus the amplified light beam 325 reflected from the mirror 950 and from another intermediate mirror 985 to the target location 910 within the chamber 930. In this implementation, the converging lens 955 is a plano-convex lens that is placed in a wall 990 of the chamber 930 so that the lens 955 acts as a window between a vacuum maintained within the chamber 930 and a purged environment external to the chamber 930. A bellows (not shown) can be placed between the vacuum chamber wall 990 and the lens 955 to facilitate movement of the lens 955 along one or more of the three directions that are relative to a direction of the light beam 325; an axial direction that extends along the direction of the light beam 325 and two directions that are transverse to the axial direction. The focus assembly 920 can also include a metrology system 960 that captures light 965 reflected off the lens 955 and directed through a central opening within the mirror 950.

The extreme ultraviolet light vacuum chamber 930 houses the extreme ultraviolet light collector 935 that is configured to collect extreme ultraviolet light emitted from the target material at the target location 910 when the amplified light beam 325 crosses the target location 910 and strikes the target material.

In the implementations of FIGS. 7-9, the metrology system 760, 860, 960 includes an optical component 761, 861, 961 that separates the light 765, 865, 965 into two beams, a first beam 762, 862, 962 being a beam at the wavelength of the amplified light beam 325 and a second beam 763, 863, 963 being a beam at the wavelength of the guide laser 175 to permit separate analysis of each of these beams. In the implementations shown in FIGS. 7-9, the optical component 761, 861, 961 is a dichroic mirror that reflects light at the wavelength (for example, at about 10600 nm) of the amplified light beam 325 and transmits light at the wavelength (for example, about 11150 nm) of the light produced by the guide laser 175. The metrology system 760, 860, 960 also includes a detector 764, 864, 964 (for example, a pyroelectric solid-state detector array) that receives the separated light beams and analyzes features of the beam. The detector 764, 864, 964 outputs a signal of the analyzed beam features and the output signal is sent to the master controller 155, which uses the output signal to determine an amount of positional adjustment to apply to the lens 755, 855, 955 and/or to one or more movable mirrors (for example, mirror 750, 850, 950) of the beam delivery system 700, 800, 900 to thereby increase overlap of the amplified light beam 325 with the target material 114 at the target location 105 and to therefore increase the amount of EUV production. The metrology system 760, 860, 960 can include other optical components such as filters, lenses, beam splitters, and mirrors to modify the light in other ways prior to reaching the detector 764, 864, 964. The metrology system 760, 860, 960 is shown and described in detail in U.S. application Ser. No. 12/637,961, entitled "Metrology for Extreme Ultra-Violet Light Source" and filed on Dec. 15, 2009.

In general, the converging lens 355, 755, 855, 955 can be an aspheric lens to reduce spherical aberrations and other optical aberrations that can occur with spherical lens.

In the implementations shown above, the converging lens 755, 855, 955 is mounted as a window on a wall 790, 890, 990 of the chamber 730, 830, 930 by mounting the lens in a housing that is located outside the chamber but is mounted to the chamber wall. In the implementation shown in FIG. 8, the converging lens 855 is mounted inside the chamber 830. In other implementations, the converging lens 355 can be mounted at an exterior of the chamber 130 so as not to form a pressure-resistant window.

The lens 355 can be configured to be movable; in this case, the lens 355 can be mounted to one or more actuators to provide a mechanism for active focus control during operation of the system. In this way, the lens 355, 755, 855, 955 can be moved to more efficiently collect the amplified light beam 325 and direct the light beam 325 to the target location to increase or maximize the amount of EUV production. The amount and direction of displacement of the lens 355, 755, 855, 955 is determined based on the feedback provided by the metrology system 760, 860, 960, as described in the application noted above.

The converging lens 355, 755, 855, 955 has a diameter that is large enough to capture most of the amplified light beam 325 yet provide enough curvature to focus the amplified light beam 325 to the target location. In some implementations, the converging lens 355, 755, 855, 955 can have a numerical aperture of at least about 0.1, and, in particular, at least about 0.2.

In some implementations, the converging lens 355, 755, 855, 955 is made of ZnSe, which is a material that can be used for infrared applications. ZnSe has a transmission range covering 0.6 to 20 μm and can be used for high power light beams that are produced from high power amplifiers. ZnSe has a low thermal absorption in the red (specifically, the infrared) end of the electromagnetic spectrum. Other materials that can be used for the converging lens include, but aren't limited to: gallium arsenide (GaAs), germanium, silicon, amorphous material transmitting infrared radiation (AMTIR), and diamond.

Moreover, the converging lens 355, 755, 855, 955 can include an anti-reflective coating and can transmit at least 95% of the amplified light beam 325 at the wavelength of the amplified light beam 325.

Figure 10B:
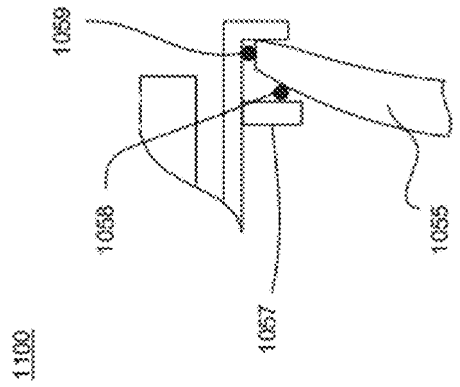
FIG. 10 is a cross-sectional diagram of an exemplary converging lens mounted to a housing that is mounted to a vacuum chamber, where the converging lens is used in the beam delivery system of FIGS. 2 and 3.
Figure 10A:
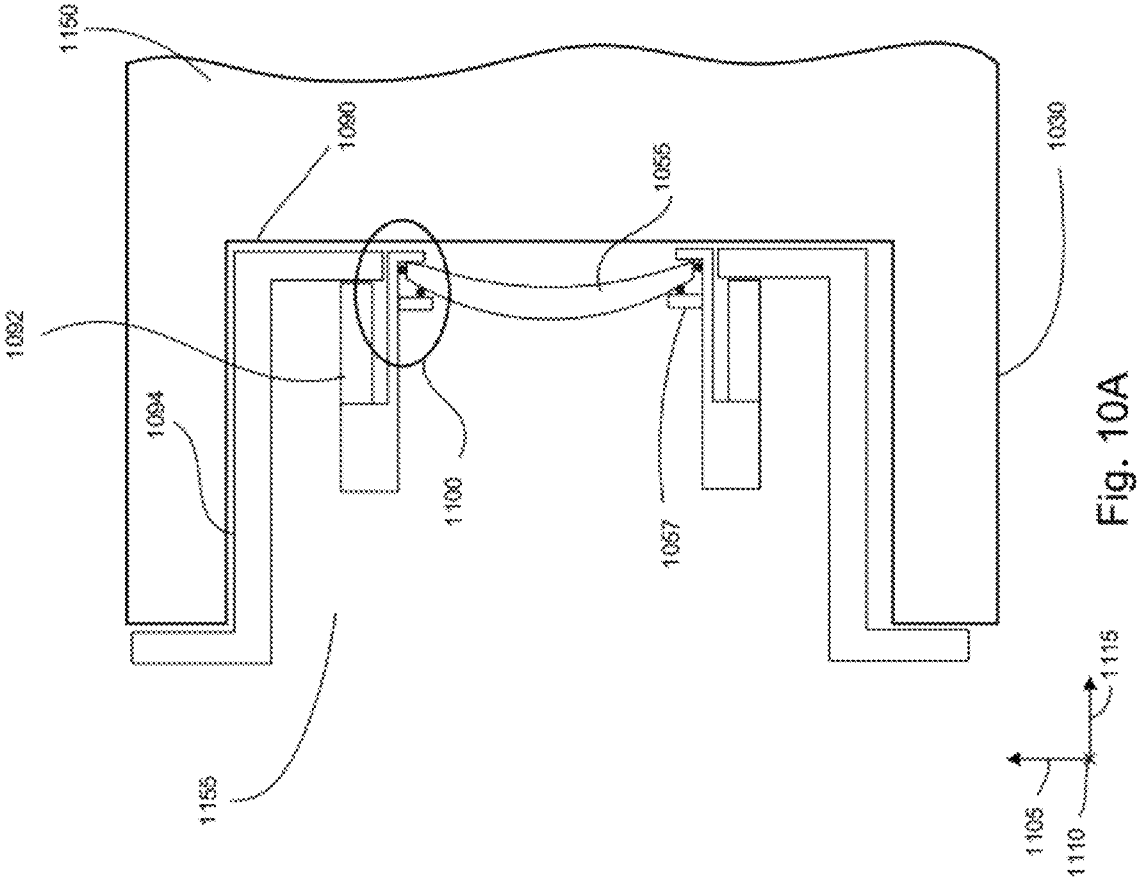

Referring also to FIGS. 10A and 10B, an exemplary mounting system is shown for mounting a converging lens 1055 in a housing 1094 that is mounted to a wall 1090 of a vacuum chamber 1030 such that an opening of the lens housing 1094 aligns with an opening of the chamber wall 1090. The lens 1055 is mounted and sealed laterally (along directions 1105 and 1110) and axially (along direction 1115) in the lens housing 1094 with flexible O-rings 1058, 1059. Moreover, a pliable retaining ring (for example, made of a metal or metal alloy) 1057 is bolted to the housing 1094 to hold the lens axially (along direction 1115). The compressed O-ring 1058 between the retaining ring 1057 and the lens 1055 prevents the retaining ring 1057 from scratching or damaging the lens 1055 while maintaining a force against the lens 1055 to hold it in place. Additionally, the compressed O-ring 1058 provides a vacuum seal between a vacuum environment 1150 within the chamber 1030 and a purged environment (for example, an environment including nitrogen gas) 1155 external to the chamber 1030. The compressed O-ring 1059 between a radial edge of the lens 1055 and the housing 1094 centers the lens radially (along the lateral directions 1105, 1110).

Figure 11A:
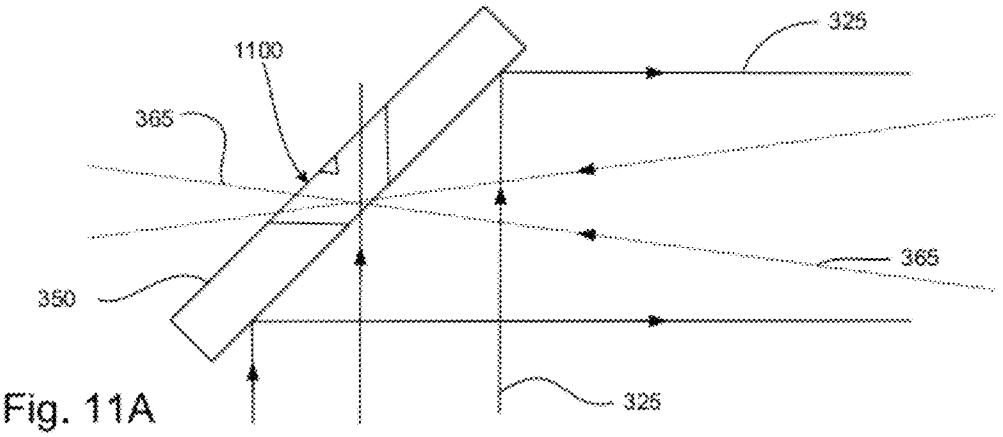
FIGS. 11A-11C are side cross sectional views of exemplary pre-lens mirrors that can be used in the beam delivery system of FIGS. 3-9.
Figure 11B:
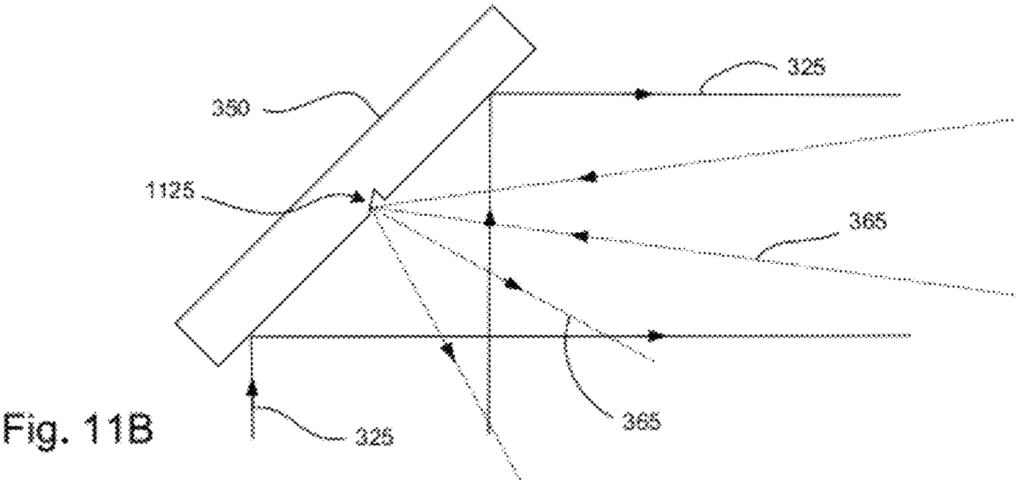
Figure 11C:
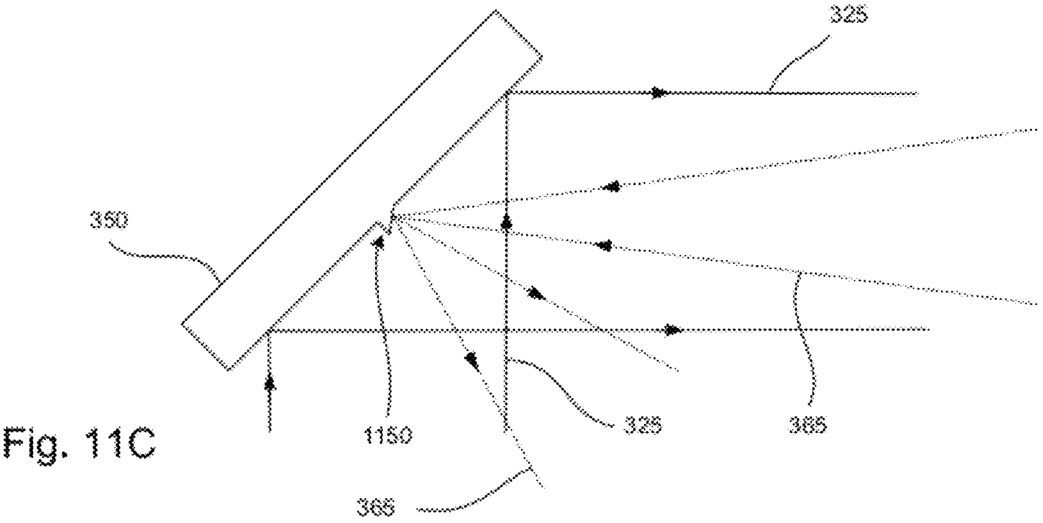

Referring also to FIGS. 11A, 11B, and 11C, the mirror 350 is formed with a feature to separate the reflected light 365 from the amplified light beam 325. As shown in FIG. 11A, the feature can be a central opening 1100. Such a design is found in the mirrors 750, 950 shown, respectively, in FIGS. 7 and 9. The central opening 1100 permits the light 365 to pass through the mirror 350 since the light 365 focuses to a focal region within the opening 1100 and the central opening 1100 reflects substantially all of the amplified light beam 325 toward the lens 355 except for a small fraction of the amplified light beam 325 that is directed through the mirror 350 but not toward the metrology system 360.

As shown in FIG. 11B, the feature can be an internal offset facet 1125, or as shown in FIG. 11C, the feature can be an external offset facet 1150. Either of these designs can be used in the mirror 850 shown in FIG. 8. The offset facet 1125 or 1150 reflects the light 365 in a direction that is distinct from the direction of the amplified light beam 325. In particular, the reflected light 365 off the lens 355 is directed toward the mirror 350, which is designed with the feature that enables the reflected light 365 to enter the metrology system 360 for diagnostic purposes and that reflects the amplified light beam 325 and any laser light that is emitted from the target material along a different direction so as not to enter the metrology system 360.

Other implementations are within the scope of the following claims.

Although the detector 165 is shown in FIG. 1 positioned to receive light directly from the target location 105, the detector 165 could alternatively be positioned to sample light at or downstream of the intermediate focus 145 or some other location.

In general, irradiation of the target material 114 can also generate debris at the target location 105, and such debris can contaminate the surfaces of optical elements including but not limited to the collection mirror 135. Therefore, a source of gaseous etchant capable of reaction with constituents of the target material 114 can be introduced into the chamber 130 to clean contaminants that have deposited on surfaces of optical elements, as described in U.S. Pat. No. 7,491,954, which is incorporated herein by reference in its entirety. For example, in one application, the target material can include Sn and the etchant can be HBr, $Br_2$, $Cl_2$, HCl, $H_2$, $HCF_3$, or some combination of these compounds.

The light source 100 can also include one or more heaters 170 that initiate and/or increase a rate of a chemical reaction between the deposited target material and the etchant on a surface of an optical element. For a plasma target material that includes Li, the heater 170 can be designed to heat the surface of one or more optical elements to a temperature in the range of about 400 to 550° C. to vaporize Li from the surface, that is, without necessarily using an etchant. Types of heaters that can be suitable include radiative heaters, microwave heaters, RF heaters, ohmic heaters, or combinations of these heaters. The heater can be directed to a specific optical element surface, and thus be directional, or it can be non-directional and heat the entire chamber 130 or substantial portions of the chamber 130.

What is claimed is:

1. An extreme ultraviolet light system comprising:

a drive laser system that produces an amplified light beam;

a target material delivery system configured to produce a target material at a target location; and a beam delivery system that is configured to receive the amplified light beam emitted from the drive laser system and to direct the amplified light beam toward the target location, wherein the beam delivery system includes a beam expansion system that includes a curved mirror having a reflective surface that is an off-axis segment of an elliptic paraboloid.

2. The system of claim 1, wherein the target material delivery system includes a target material outlet capable of outputting the target material along a target material path that crosses the target location.

3. The system of claim 1, wherein the curved mirror is a diverging curved mirror.

4. The system of claim 3, further comprising a converging lens, wherein:

the curved mirror receives the amplified light beam from the drive laser system, and the converging lens receives the diverging light beam reflected off the curved mirror and substantially collimates the light beam into a collimated amplified light beam having a cross section that is larger than the cross section of the amplified light beam impinging upon the curved mirror.

5. The system of claim 1, wherein the curved mirror is a converging curved mirror.

6. The system of claim 5, further comprising a diverging lens, wherein:

the diverging lens receives the amplified light beam from the drive laser system; and the converging mirror receives the diverging light beam transmitted through the diverging lens and reflects a substantially collimated amplified light beam having a cross section that is larger than the cross section of the amplified light beam impinging upon the diverging lens.

7. The system of claim 1, further comprising another curved mirror having a reflective surface that is an off-axis segment of an elliptic paraboloid, wherein:

the curved mirror is a diverging curved mirror that receives the amplified light beam from the drive laser system, and the other curved mirror is a converging curved mirror that is placed to receive the diverging light beam reflected off the curved mirror and to substantially collimate the light beam into a collimated amplified light beam having a cross section that is larger than the cross section of the amplified light beam impinging upon the curved mirror.

8. The system of claim 1, further comprising a collector device having an aperture through which the amplified light beam passes as it is directed toward the target location.

9. The system of claim 1, further comprising a chamber in which the target location is located, wherein the beam delivery system is external to the chamber.

10. The system of claim 1, further comprising a focus assembly that focuses the amplified light beam at the target location, wherein the beam delivery system is between the focus assembly and the drive laser system.

11. An extreme ultraviolet light system comprising:

a drive laser system that produces an amplified light beam;

a target material delivery system configured to produce a target material at a target location;

an extreme ultraviolet light vacuum chamber defining an interior space that is configured to be evacuated to sub-atmospheric pressure, wherein the vacuum chamber houses within the interior space an extreme ultraviolet light collector configured to collect extreme ultraviolet light emitted from the target material when the amplified light beam crosses the target location and strikes the target material, wherein the target location is in the interior space of the vacuum chamber; and a beam delivery system that is configured to receive the amplified light beam emitted from the drive laser system and to direct the amplified light beam toward the target location, wherein the beam delivery system includes:

a beam expansion system that expands a size of the amplified light beam, and a focusing element that includes a converging lens configured and arranged to focus the amplified light beam at the target location, wherein the focusing element forms a pressure-resistant window of the vacuum chamber to separate the interior space from an exterior space.

12. An extreme ultraviolet light system comprising:

a drive laser system that produces an amplified light beam;

a target material delivery system configured to produce a target material at a target location;

a mirror that receives the amplified light beam and redirects the amplified light beam, and a focusing element that includes a converging lens configured and arranged to focus the redirected amplified light beam at the target location;

wherein the mirror includes a feature that separates a diagnostic portion of light reflected from a surface of the converging lens from the amplified light beam and directs the separated diagnostic light portion to a metrology system that is configured to analyze properties of the amplified light beam based on the collected separated diagnostic light portion.

13. The system of claim 12, wherein the mirror and the focusing element are a part of a beam delivery system that is configured to receive the amplified light beam emitted from the drive laser system and to direct the amplified light beam toward the target location.

14. The system of claim 13, wherein the beam delivery system further comprises a set of optical components that change one or more of a direction and a wavefront of the amplified light beam before directing the amplified light beam toward the mirror.

15. The system of claim 13, wherein the mirror feature is an opening defined within a central region of the mirror.

16. The system of claim 13, wherein the mirror feature is a facet defined at a central region of the mirror.

17. A method for producing extreme ultraviolet light, the method comprising:

receiving a measured light parameter associated with extreme ultraviolet light emitted from a target material at a target location when an amplified light beam from a laser system strikes the target material;

receiving an image of a diagnostic extreme ultraviolet light portion reflected off the target material at the target location;

receiving an image of a diagnostic amplified light portion that is reflected off a converging lens that focuses the amplified light beam to the target location to strike the target material;

analyzing the received measured light parameter, the received diagnostic extreme ultraviolet light portion image, and the received diagnostic amplified light portion image; and controlling one or more of components within a beam transport system placed between the laser system and the target location to adjust a relative position between the amplified light beam and the target location to thereby increase an amount of extreme ultraviolet light produced when the amplified light beam strikes the target material based on the analysis.

18. The method of claim 17, wherein controlling the one or more of components within the beam transport system includes adjusting one or more of a position of the converging lens and a position of one or more mirrors within the beam transport system.

19. The method of claim 18, wherein adjusting the position of one or more mirrors within the beam transport system includes adjusting a mirror that includes a feature that separates the diagnostic amplified light portion from the amplified light beam.

20. The method of claim 19, further comprising receiving an image of a diagnostic portion of a guide laser beam that is directed to the target location;

wherein analyzing the received diagnostic amplified light portion image includes analyzing the diagnostic guide laser beam portion image.

21. An extreme ultraviolet light system comprising:

a drive laser system that produces an amplified light beam;

a target material delivery system configured to produce a target material at a target location; and a beam delivery system that is configured to receive the amplified light beam emitted from the drive laser system and to direct the amplified light beam toward the target location, wherein the beam delivery system includes:

a beam expansion system that includes at least one curved mirror that expands a size of the amplified light beam, and a focusing element that includes a converging lens configured and arranged to focus the amplified light beam at the target location.

22. The system of claim 21, wherein the converging lens is an aspheric lens.

23. The system of claim 21, wherein the converging lens is made of zinc selenide.

24. The system of claim 21, wherein the converging lens is inside an extreme ultraviolet light vacuum chamber within which the target location is positioned, the chamber housing an extreme ultraviolet light collector configured to collect extreme ultraviolet light emitted from the target material when the amplified light beam crosses the target location and strikes the target material.

25. The system of claim 21, wherein the converging lens is a window of an extreme ultraviolet light chamber that provides a leak tight barrier between the vacuum within the light chamber and an external environment.

26. The system of claim 21, wherein the beam delivery system comprises an actuation system mechanically coupled to the converging lens and configured to move the converging lens to focus the amplified light beam to the target location.

27. The system of claim 21, further comprising a collector device having an aperture through which the amplified light beam passes as it is directed toward the target location.

28. The system of claim 21, further comprising a chamber in which the target location is located, wherein the beam delivery system is external to the chamber.

29. The system of claim 21, wherein the beam expansion system is between the focusing element and the drive laser system.

30. The system of claim 21, wherein the beam delivery system comprises a metrology system that detects the amplified light beam reflected at the converging lens.

31. The system of claim 30, further comprising a controller connected to the metrology system and to the actuation system coupled to the converging lens, wherein the controller is configured to move the converging lens based on the output from the metrology system.

32. The system of claim 31, wherein the beam delivery system comprises a pre-lens mirror that redirects the amplified light beam from the expansion system toward the converging lens.

33. The system of claim 32, wherein the pre-lens mirror is coupled to a mirror actuation system that is connected to the controller to permit movement of the mirror based on the output from the metrology system.

34. A method for producing extreme ultraviolet light, the method comprising:

producing a target material at a target location;

supplying pump energy to a gain medium of at least one optical amplifier in a drive laser system to produce an amplified light beam;

expanding a transverse cross sectional area of the amplified light beam; and focusing the expanded amplified light beam onto the target location by directing the expanded amplified light beam through a converging lens.

35. The method of claim 34, further comprising collecting extreme ultraviolet light emitted from the target material when the amplified light beam crosses the target location and strikes the target material.

36. The method of claim 34, further comprising moving the converging lens to focus the amplified light beam to the target location based on an analysis of light reflected off the converging lens.

37. The method of claim 34, further comprising reflecting the expanded amplified light beam off a pre-lens mirror that redirects the expanded amplified light beam toward the converging lens.

38. The method of claim 37, further comprising moving the pre-lens mirror based on an analysis of light reflected off the converging lens.

* * * * *